(12) United States Patent
Gokmen et al.

(10) Patent No.: US 10,269,425 B2
(45) Date of Patent: Apr. 23, 2019

(54) CIRCUIT METHODOLOGY FOR HIGHLY LINEAR AND SYMMETRIC RESISTIVE PROCESSING UNIT

(71) Applicant: International Business Machines Corporation, Armonk, NY (US)

(72) Inventors: Tayfun Gokmen, Briarcliff Manor, NY (US); Seyoung Kim, White Plains, NY (US); Hyung-Min Lee, Yorktown Heights, NY (US); Wooram Lee, Briarcliff Manor, NY (US); Paul Michael Solomon, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/831,059

(22) Filed: Dec. 4, 2017

(65) Prior Publication Data
US 2018/0114572 A1    Apr. 26, 2018

Related U.S. Application Data

(63) Continuation of application No. 15/335,171, filed on Oct. 26, 2016, now Pat. No. 9,852,790.

(51) Int. Cl.
| G11C 11/00 | (2006.01) |
| G11C 13/00 | (2006.01) |
| G06N 3/02 | (2006.01) |
| G11C 7/10 | (2006.01) |
| G11C 11/54 | (2006.01) |

(52) U.S. Cl.
CPC .......... G11C 13/004 (2013.01); G06N 3/02 (2013.01); G11C 7/1006 (2013.01); G11C 11/54 (2013.01); G11C 13/0002 (2013.01); G11C 13/0007 (2013.01); G11C 13/0038 (2013.01); G11C 13/0069 (2013.01); *G11C 2213/77* (2013.01)

(58) Field of Classification Search
CPC .......... G11C 13/004; G11C 13/0007; G11C 13/0038; G11C 13/0069
See application file for complete search history.

(56) References Cited

U.S. PATENT DOCUMENTS

| 5,136,176 A | 8/1992 | Castro |
| 5,668,508 A | 9/1997 | Pulvirenti et al. |
| 5,825,218 A | 10/1998 | Colli et al. |
| 6,597,598 B1 | 7/2003 | Tran et al. |
| 6,597,898 B1 | 7/2003 | Iwata et al. |
| 6,937,025 B1 * | 8/2005 | Fong ............. G01R 19/25 324/522 |
| 7,079,436 B2 | 7/2006 | Perner et al. |
| 8,275,727 B2 | 9/2012 | Elmegreen et al. |

(Continued)

OTHER PUBLICATIONS

U.S. Notice of Allowance dated Aug. 15, 2017 in U.S. Appl. No. 15/335,171.

(Continued)

*Primary Examiner* — Pho M Luu
(74) *Attorney, Agent, or Firm* — Vazken Alexanian; McGinn IP Law Group, PLLC

(57) ABSTRACT

A processing unit includes a circuit including a current mirror, and a capacitor providing a weight based on a charge level of the capacitor. The capacitor is charged or discharged by the current mirror.

20 Claims, 13 Drawing Sheets

(56) References Cited

U.S. PATENT DOCUMENTS

| 9,595,310 B2* | 3/2017 | Zhang | G11C 8/10 |
| 9,852,790 B1* | 12/2017 | Gokmen | G06N 3/02 |
| 2015/0170025 A1 | 6/2015 | Wu et al. | |
| 2016/0049195 A1 | 2/2016 | Yu et al. | |

OTHER PUBLICATIONS

U.S. Non-Final Office Action dated May 2, 2017 in U.S. Appl. No. 15/335,171.
URL: arxiv.org/ftp/arxiv/papers/1603/1603.07341.pdf, Paper, authored by Gokmen et al., entitled "Acceleration of Deep Neural Network Training with Resistive Cross-Point Devices".

* cited by examiner

US 10,269,425 B2

CIRCUIT METHODOLOGY FOR HIGHLY LINEAR AND SYMMETRIC RESISTIVE PROCESSING UNIT

CROSS-REFERENCE TO RELATED APPLICATION

The present application is a Continuation Application of U.S. patent application Ser. No. 15/335,171, which is now U.S. Pat. No. 9,852,790, filed on Oct. 26, 2016, the entire contents of which are hereby incorporated by reference.

BACKGROUND OF THE INVENTION

Field of the Invention

The present invention relates generally to a method, system, and apparatus for a resistive processing unit, and more particularly relates to a method, system, and apparatus for circuit methodology for highly linear and symmetric resistive processing unit.

Description of the Related Art

Deep Neural Networks (DNNs) demonstrated significant commercial success in the last years with performance exceeding sophisticated prior methods in speech and object recognition. However, training the DNNs is an extremely computationally intensive task that requires massive computational resources and enormous training time that hinders their further application. Instead of a usual time complexity, the problem can be reduced therefore to a constant time independent of the array size. However, the addressable problem size is limited to the number of nodes in the array that is challenging to scale up to billions even with the most advanced CMOS (complementary-metal-oxide-semiconductor) technologies.

Recent implementations have the problem where estimated acceleration factors are limited by device specifications intrinsic to their application as NVM (non-volatile memory) cells.

Device characteristics usually considered beneficial or irrelevant for memory applications such as high on/off ratio, digital bit-wise storage, and asymmetrical set and reset operations, are becoming limitations for acceleration of DNN training. These non-ideal device characteristics can potentially be compensated with a proper design of peripheral circuits and a whole system, but only partially and with a cost of significantly increased operational time.

There is a need to provide an RPU circuit which can be highly linear and symmetric in order to implement practical ANNs (artificial neural networks).

SUMMARY OF INVENTION

In view of the foregoing and other problems, disadvantages, and drawbacks of the aforementioned background art, an exemplary aspect of the present invention provides a system, apparatus, and method of providing a method, system, and apparatus for a circuit methodology for highly linear and symmetric resistive processing unit.

One aspect of the present invention provides a resistive processing unit (RPU), including a circuit having at least two current mirrors connected in series, and a capacitor connected with the at least two current mirrors, the capacitor providing a weight based on a charge level of the capacitor. The capacitor is charged or discharged by one of the at least two current mirrors.

Another aspect of the present invention provides a method of a resistive processing unit (RPU), the method including charging or discharging a capacitor of the resistive processing unit by one of at least two series connected current mirrors, and providing a weight based on a charge level of the capacitor connected to the current mirrors.

Yet another aspect of the present invention provides array of resistive processing units (RPUs), each RPU including a circuit having at least two current mirrors that are connected, and a capacitor connected with the at least two current mirrors, the capacitor providing a weight based on a charge level of the capacitor. The capacitor is charged or discharged by one of the at least two current mirrors.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF DRAWINGS

The exemplary aspects of the invention will be better understood from the following detailed description of the exemplary embodiments of the invention with reference to the drawings.

FIG. 2 B illustrates a classification error curve including a baseline model where a non-linearity factor is varied.

FIG. 2 C illustrates three set of conductance change versus voltage curves for different non-linearity factors.

DETAILED DESCRIPTION OF A PREFERRED EMBODIMENTS

Figures 1A, 1B:
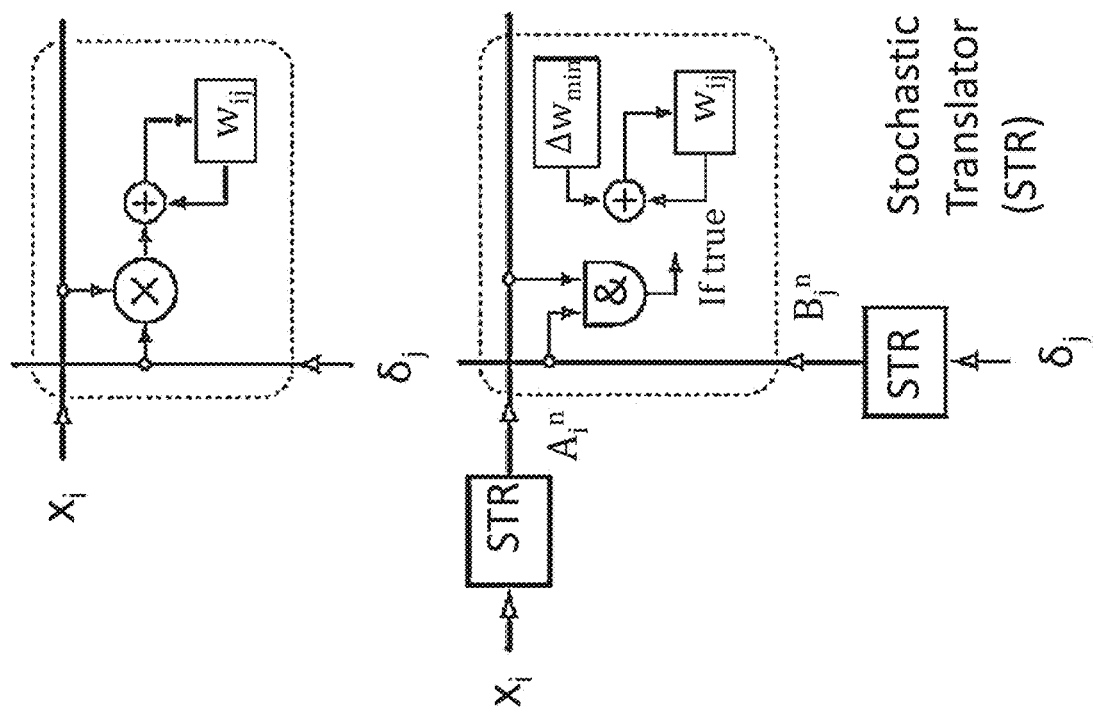
FIG. 1A illustrates Schematics of original weight update rule of Equation 1 performed at each cross-point.
FIG. 1B illustrates the stochastic update rule where numbers that are encoded from neurons.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

As mentioned, training the DNNs is an extremely computationally intensive task that requires massive computational resources and enormous training time that hinders their further application. For example, a 70% relative improvement has been demonstrated for a DNN with 1 billion connections that was trained on a cluster with 1000 machines for three days. Training the DNNs relies in general on the backpropagation algorithm that is intrinsically local and parallel. Various hardware approaches to accelerate DNN training that are exploiting this locality and parallelism have been explored with a different level of success starting from the early 90s to current developments with GPU, FPGA or specially designed ASIC. Further acceleration is possible by fully utilizing the locality and parallelism of the algorithm. For a fully connected DNN layer that maps neurons to neurons significant acceleration can be achieved by minimizing data movement using local storage and processing of the weight values on the same node and connecting nodes together into a massive systolic array where the whole DNN can fit in. Instead of a usual time complexity, the problem can be reduced therefore to a constant time independent of the array size. However, the addressable problem size is limited to the number of nodes in the array that is challenging to scale up to billions even with the most advanced CMOS technologies. Novel nanoelectronic device concepts based on non-volatile memory (NVM) technologies, such as phase change memory (PCM) and resistive random access memory (RRAM), have been explored recently for implementing neural networks with a learning rule inspired by spike-timing-dependent plasticity (STDP) observed in biological systems.

Only recently, their implementation for acceleration of DNN training using backpropagation algorithm have been considered with reported acceleration factors ranging from 27× to 900×, and even 2140× and significant reduction in power and area. All of these bottom-up approaches of using previously developed memory technologies looks very promising, however the estimated acceleration factors are limited by device specifications intrinsic to their application as NVM cells.

Device characteristics usually considered beneficial or irrelevant for memory applications such as high on/off ratio, digital bit-wise storage, and asymmetrical set and reset operations, are becoming limitations for acceleration of DNN training. These non-ideal device characteristics can potentially be compensated with a proper design of peripheral circuits and a whole system, but only partially and with a cost of significantly increased operational time.

Therefore, as mentioned, there is a need to provide an RPU circuit which can be highly linear and symmetric in order to implement practical ANNs.

Resistive processing units (RPUs) indicate trainable resistive crosspoint circuit elements which can be used to build artificial neural networks (ANNs) and dramatically accelerate the ability of ANNs by providing local data storage and local data processing. Since a highly symmetric and linear programming property of RPU device is required to implement practical ANNs, finding a linear and symmetric RPU implementation is a key to take advantage of the RPU-based ANN implementation. Here, it is proposed a CMOS-based RPU circuit that can be highly linear and symmetric.

In a related art, there is a disclosure of how the learning rate can be controlled using the length of stochastic bits streams or the population probability of the stochastic bits streams. Those techniques make it possible to control the learning rate although each has some drawbacks. For very large learning rates increasing the bit length slows down the overall performance of the training. Similar for very small learning rates reducing the population probability of the streams would make the updates too stochastic and training may not achieve low enough accuracies. In the present invention, it is shown how the learning rate can be controlled by varying the voltage of the pulses so that the learning rate can be varied in a large range without sacrificing on training time and accuracies.

The present invention provides a proposed new class of devices (RPU) that can be used as processing units to accelerate various algorithms including neural network training. In the present invention it is shown how the operating voltage of these array of RPU devices can be controlled to tune the learning rate for the neural network training. One way of tuning the learning rate is by controlling time duration of the pulses, however for very large learning rates this approach would be significantly slow as very long duration might be needed for the update cycle. Whereas here the present invention proposes that the operating voltage can be controlled to achieve larger or smaller learning rates.

One of the features of the invention is to use a voltage pulse height control to vary the learning rate of DNN training on RPU hardware so that system does not sacrifice neither time (for large learning rates) nor accuracy (for small learning rates).

The described method has the advantage of controlling learning rate without changing the time needed for the update cycle. The present approach should therefore be faster than the approaches where the duration of pulses control the learning rate.

Artificial neural networks (ANNs) can formed from crossbar arrays of RPUs that provide local data storage and local data processing without the need for additional processing elements beyond the RPU. The trainable resistive crosspoint devices are referred to as resistive processing units (RPUs).

Crossbar arrays (crosspoint arrays or crosswire arrays) are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material.

Crosspoint devices, in effect, function as the ANN's weighted connections between neurons. Nanoscale two-terminal devices, for example memristors having conduction state switching characteristics, are often used as the crosspoint devices in order to emulate synaptic plasticity with high energy efficiency. The conduction state (e.g., resistance) of the memristive material may be altered by controlling the voltages applied between individual wires of the row and column wires.

The backpropagation algorithm is composed of three cycles, forward, backward and weight update that are repeated many times until a convergence criterion is met. The forward and backward cycles mainly involve computing vector-matrix multiplication in forward and backward directions. This operation can be performed on a 2D crossbar array of two terminal resistive devices as it was proposed more than 50 years ago. In forward cycle, stored conductance values in the crossbar array form a matrix, whereas the input vector is transmitted as voltage pulses through each of the input rows. In a backward cycle, when voltage pulses are supplied from columns as an input, then the vector-matrix product is computed on the transpose of a matrix. These operations achieve the required O(1) time complexity, but only for two out of three cycles of the training algorithm.

In contrast to forward and backward cycles, implementing the weight update on a 2D crossbar array of resistive devices locally and all in parallel, independent of the array size, is challenging. It requires calculating a vector-vector outer product which consist of a multiplication operation and an incremental weight update to be performed locally at each cross-point as illustrated in FIG. 1A. The corresponding update rule is usually expressed as:

$$w_{ij} \leftarrow w_{ij} + \eta x_i \delta_j \quad (1)$$

where $w_{ij}$ represents the weight value for the $i^{th}$ row and the $j^{th}$ column (for simplicity layer index is omitted) and $x_i$ is the activity at the input neuron, $\delta_j$ is the error computed by the output neuron and $\eta$ is the global learning rate.

In order to implement a local and parallel update on an array of two-terminal devices that can perform both weight storage and processing (Resistive Processing Unit or RPU) we first propose to significantly simplify the multiplication operation itself by using stochastic computing techniques. It has been shown that by using two stochastic streams the multiplication operation can be reduced to a simple AND operation. FIG. 1B illustrates the stochastic update rule where numbers that are encoded from neurons ($x_i$ and $\delta_j$) are translated to stochastic bit streams using stochastic translators (STR). Then they are sent to the crossbar array where each RPU device changes its conductance ($g_{ij}$) slightly when bits from $x_i$ and $\delta_j$ coincide. In this scheme we can write the update rule as follows:

$$w_{ij} \leftarrow \Delta w_{min} \pm \Delta w_{min} \Sigma_{n=1}^{BL} A_i^n \wedge B_j^n \quad (2)$$

where BL is length of the stochastic bit stream at the outputs of STRs that is used during the update cycle, $\Delta w_{min}$ is the change in the weight value due to a single coincidence event, $A_i^n$ and $B_j^n$ are random variables that are characterized by Bernoulli process, and a superscript n represents bit position in the trial sequence. The probabilities that $A_i^n$ and $B_j^n$ are equal to unity are controlled by $Cx_i$ and $C\delta_j$, respectively, where C is a gain factor in the STR.

Figure 1C:
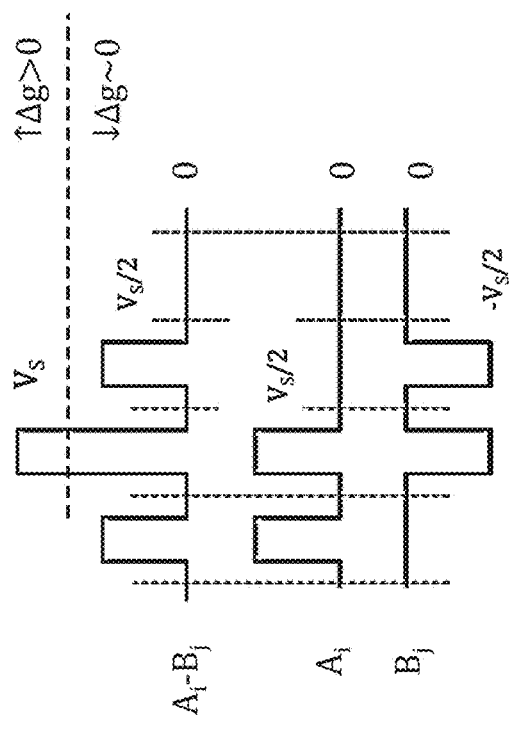
FIG. 1C illustrates one possible pulsing scheme that enables the stochastic update.
Figure 1D:
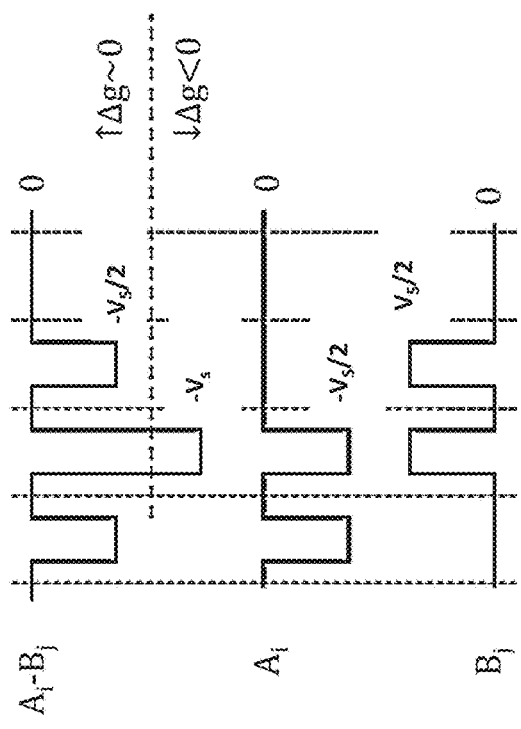
FIG. 1D illustrates Pulsing scheme that enables the implementation of stochastic updates rule by RPU devices for down conductance changes.

One possible pulsing scheme that enables the stochastic update rule of Eq. 2 is presented in FIG. 1C. The voltage pulses with positive and negative amplitudes are sent from corresponding STRs on rows ($A_i$) and columns ($B_j$), respectively. As opposed to a floating point number encoded into a binary stream, the corresponding number translated into a stochastic stream is represented by a whole population of such pulses. In order for a two-terminal RPU device to distinguish coincidence events at a cross-point, its conductance value should not change significantly when a single pulse $V_S/2$ is applied to a device from a row or a column. However, when two pulses coincide and the RPU device sees the full voltage ($V_S$) the conductance should change by nonzero amount $\Delta g_{min}$. The parameter $\Delta g_{min}$ is proportional to $\Delta w_{min}$ through the amplification factor defined by peripheral circuitry. To enable both up and down changes in conductance the polarity of the pulses can be switched during the update cycle as shown in FIG. 1D. The proposed pulsing scheme allows all the RPU devices in an array to work in parallel and perform the multiplication operation locally by simply relying on the statistics of the coincidence events, thus achieving the O(1) time complexity for the weight update cycle of the training algorithm.

Figures 2A, 2B, 2C:
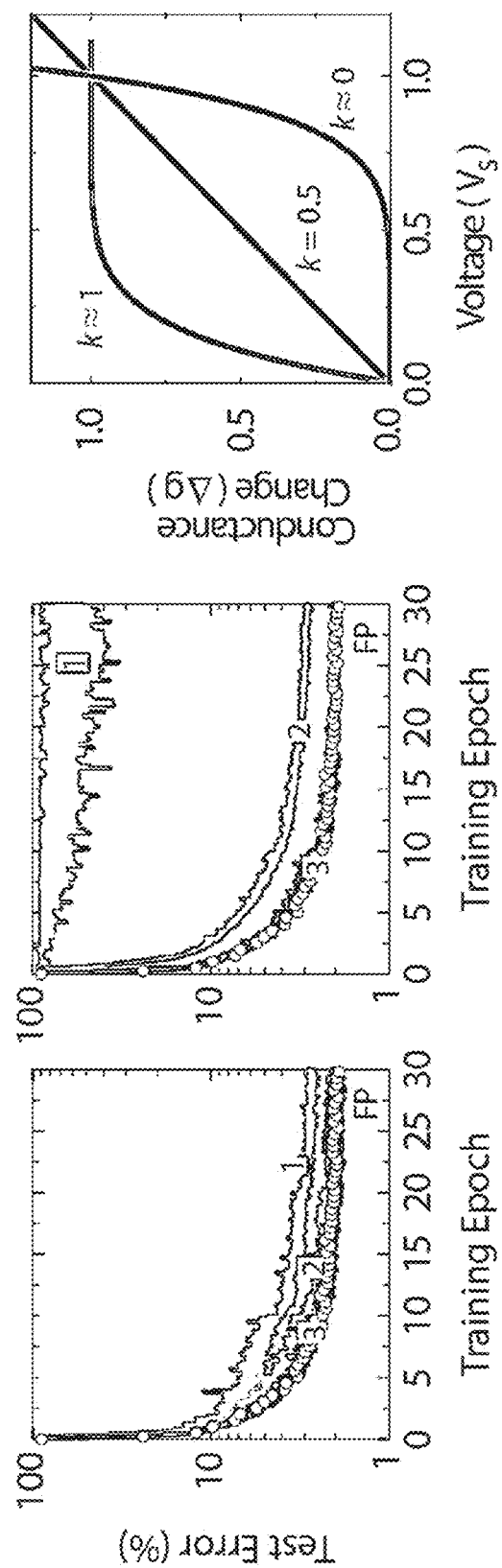
FIG. 2 A illustrates a classification error curve including a baseline model.

Network training with RPU array using stochastic update rule is shown in the following. To test the validity of this approach, we compare classification accuracies achieved with a deep neural network composed of fully connected layers with 784, 256, 128 and 10 neurons, respectively. This network is trained with a standard MNIST training dataset of 60,000 examples of images of handwritten digits using cross-entropy objective function and backpropagation algorithm. Raw pixel values of each 28×28 pixel image are given as inputs, while sigmoid and softmax activation functions are used in hidden and output layers, respectively. The temperature parameter for both activation functions is assumed to be unity. FIGS. 2A through 2B show a set of classification error curves for the MNIST test dataset of 10,000 images.

Specifically, FIG. 2A illustrates a classification error curve including a baseline model. The curve marked with open circles in FIG. 2A corresponds to a baseline model where the network is trained using an update rule as defined by Eq. 1 with a floating point multiplication operation. Typically, batch training is performed to decrease the number of updates and hence reduce the overall training time. Here, in order to test the most update demanding case, the batch size of unity is chosen throughout the following experiments. Training is performed repeatedly for all 60,000 images in training dataset, which constitutes a single training epoch. Learning rates of $\eta$=0.01, 0.005 and 0.0025 for epochs 0-10, 11-20 and 21-30, respectively, are used. The baseline model reaches classification error of 2.0% on the test data in 30 epochs.

In order to make a fair comparison between the baseline model and the stochastic model in which the training uses the stochastic update rule of Eq. 2, the learning rates need to match. In the most general form the average change in the weight value for the stochastic model can be written as $$E(\Delta w_{ij}) = BL \Delta w_{min} C^2 x_i \delta_j \quad (3)$$

Therefore the learning rate for the stochastic model is controlled by three parameters, $\Delta w_{min}$, and C that should be adjusted to match the learning rates that are used in the baseline model.

Although the stochastic update rule allows substituting multiplication operation with a simple AND operation, the result of the operation, however, is no longer exact, but probabilistic with a standard deviation to mean ratio that scales with $1/\sqrt{BL}$. Increasing the stochastic bit stream length BL would decrease the error, but in turn would increase the update time. In order to find an acceptable range of BL values that allow to reach classification errors similar to the baseline model, we performed training using different BL values while setting $\Delta w_{min}=\eta/BL$ and C=1 in order to match the learning rates used for the baseline model as discussed above. As it is shown in FIG. 2A, BL as small as 10 is sufficient for the stochastic model to become indistinguishable from the baseline model.

To determine how strong non-linearity in the device switching characteristics is required for the algorithm to converge to classification errors comparable to the baseline model, a non-linearity factor is varied as shown FIG. 2B. The non-linearity factor is defined as the ratio of two conductance changes at half and full voltages as $$k = \frac{\Delta g(V_S/2)}{\Delta g(V_S)}.$$

FIG. 2C illustrates a set of conductance change response of RPU devices versus voltage. As shown in FIG. 2C, the values of k≈1 correspond to a saturating type non-linear response, when k=0.5 the response is linear as typically considered for a memristor, and values of k≈0 corresponds to a rectifying type non-linear response. As it is shown in FIG. 2B the algorithm fails to converge for the linear response, however, a non-linearity factor k below 0.1 is enough to achieve classification errors comparable to the baseline model.

These results validate that although the updates in the stochastic model are probabilistic, classification errors can become indistinguishable from those achieved with the baseline model. The implementation of the stochastic update rule on an array of analog RPU devices with non-linear switching characteristics effectively utilizes the locality and the parallelism of the algorithm. As a result the update time is becoming independent of the array size, and is a constant value proportional to BL, thus achieving the required O(1) time complexity.

Figure 3:
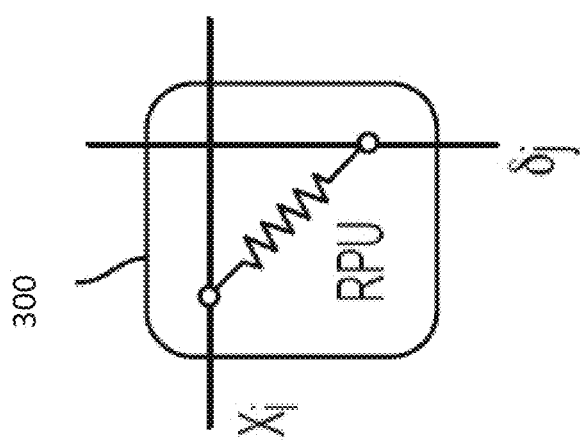
FIG. 3 illustrates an example RPU.

FIG. 3 shows an example RPU 300, which receives and responds to the stochastic voltage sequences. It is noted that Δg, which is the change in the RPU's conduction value in response to the voltage sequences applied at $x_i$ and $\delta_j$. More specifically, Δg is the response of RPU 300 to a voltage pulse that reaches $V_{DD}$.

Figure 4:
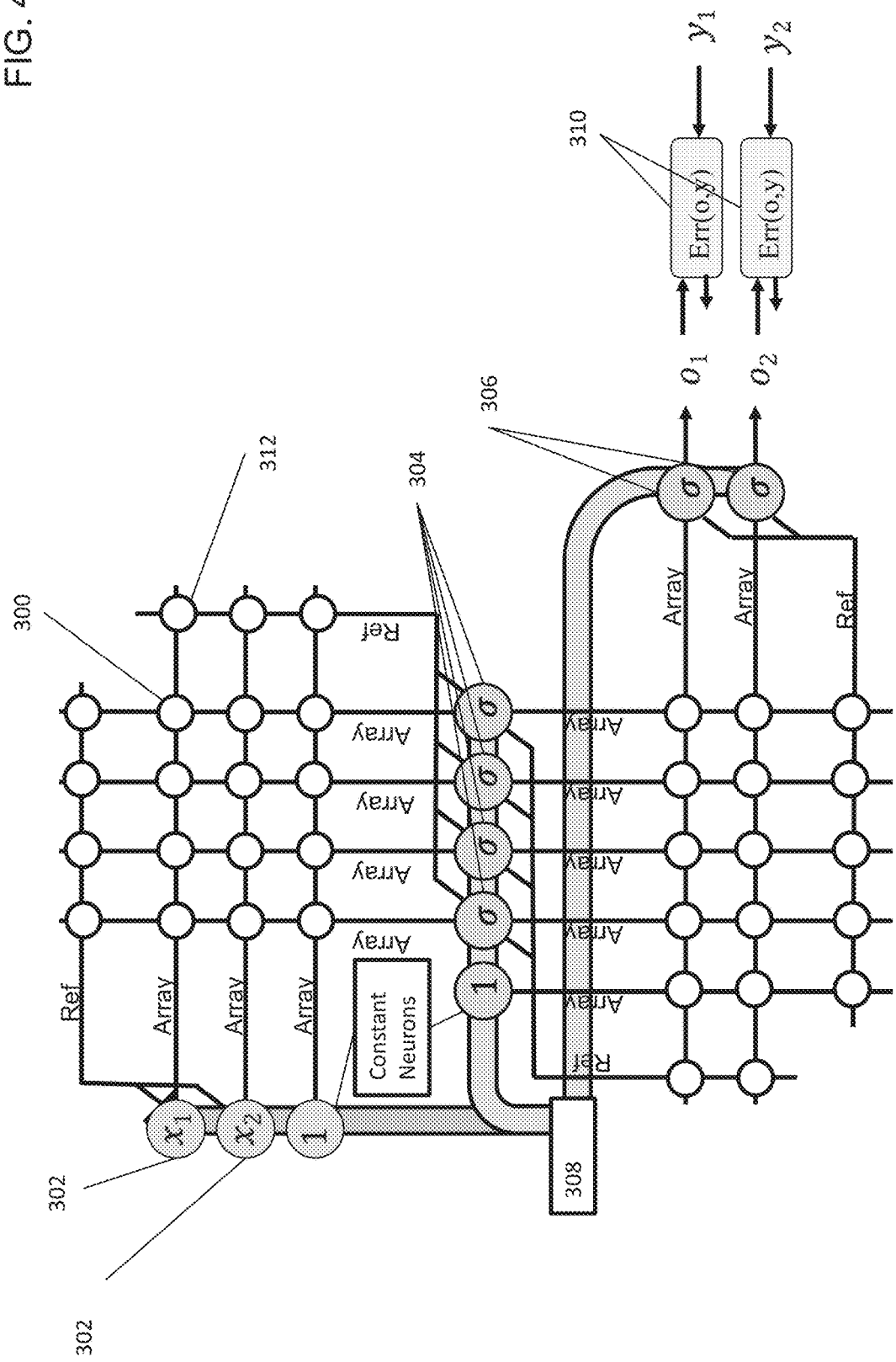
FIG. 4 illustrates a system architecture.

FIG. 4 illustrates a system architecture. The RPU device 300 is provided in the array 302. The neurons are integrated in CMOS circuitry with cross bar array of devices, which stores a matrix. The input neurons 302, along with the hidden neuron layers 306 and output neurons 304 and input signals 308 are shown. The neurons states are backward, forward and update. The units providing error is also shown. Static Reference Resistance RPU can be used here as well 312.

Figure 5:
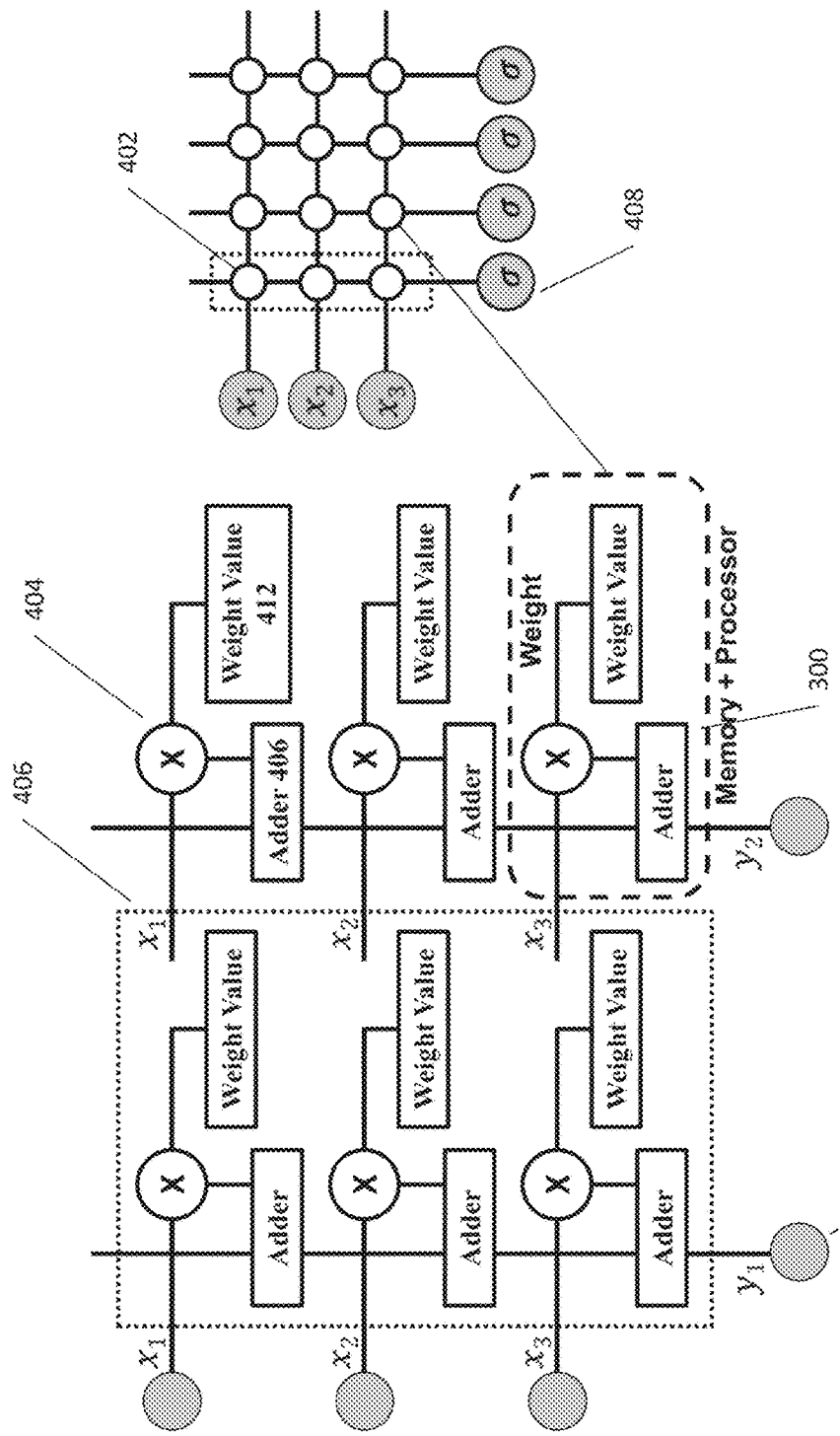
FIG. 5 illustrates Operation of the Block (Forward and Backward Pass).

FIG. 5 illustrates Operation of the Block (Forward and Backward Pass). The weights 402 are shown with weight value 404 for each of the RPUs 300 in an array. The input neurons 406 ($x_1$, $x_2$ and $x_3$) are connected to hidden neurons (σ) 408. Weights 402 (shown with weight values 412), which represent a strength of connection, are applied at the connections between the input neurons/nodes and the hidden neurons/nodes, as well as between the hidden neurons/nodes 406 and the output neurons/nodes y 420. The weights 402 form of a matrix. As data moves forward through the network, vector matrix multiplications 404 are performed, wherein the hidden neurons/nodes take the inputs, perform a non-linear transformation, and then send the results to the next weight matrix. This process continues until the data reaches the output neurons/nodes. The output neurons/nodes evaluate the classification error, and then propagate this classification error back in a manner similar to the forward pass, which results in a vector matrix multiplication being performed in the opposite direction. For each data set, when the forward pass and backward pass are completed, a weight update is performed. Basically, each weight will be updated proportionally to the input to that weight as defined by the input neuron/node 402 and the error computed by the neuron/node to which it is connected.

Figure 6A:
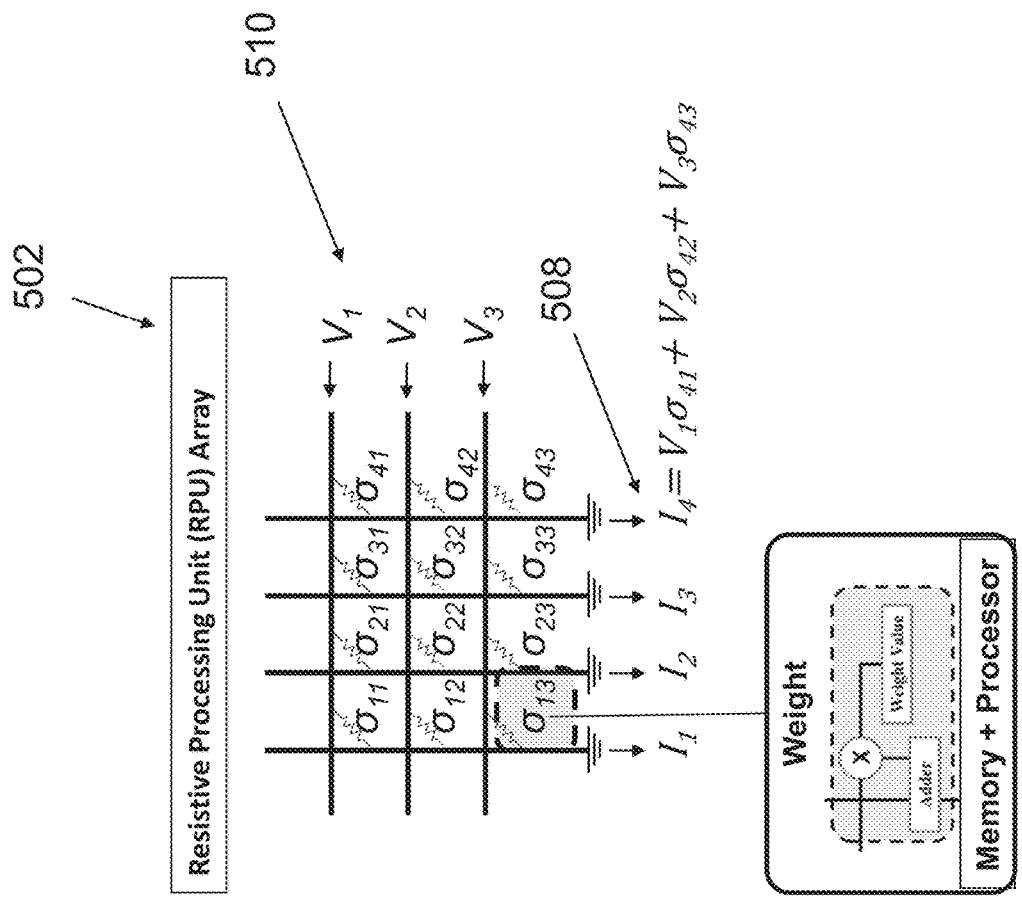
FIG. 6A illustrates Resistive Cross-Point Array Forward Pass.

FIG. 6A illustrates Resistive Cross-Point Array Forward Pass. An example resistive cross-point array (RPU) 502 is provided. The output vector "y" is the current, while the input vector "x" is the voltage. The stored weight "W" is shown which is the conductance matrix σ. The computation is parallel and no memory operation.

$$\begin{pmatrix} I_1 \\ I_2 \\ I_3 \\ I_4 \end{pmatrix} = \begin{pmatrix} \sigma_{11} & \sigma_{12} & \sigma_{13} \\ \sigma_{21} & \sigma_{22} & \sigma_{23} \\ \sigma_{31} & \sigma_{32} & \sigma_{33} \\ \sigma_{41} & \sigma_{42} & \sigma_{43} \end{pmatrix} \begin{pmatrix} V_1 \\ V_2 \\ V_3 \end{pmatrix}$$

The current vector $I_1$ to $I_4$ 508 is the output vector "y", while the input vector "x" is shown as the vector $V_1$ to $V_3$ 510 with the conductance matrix σ.

Figure 6B:
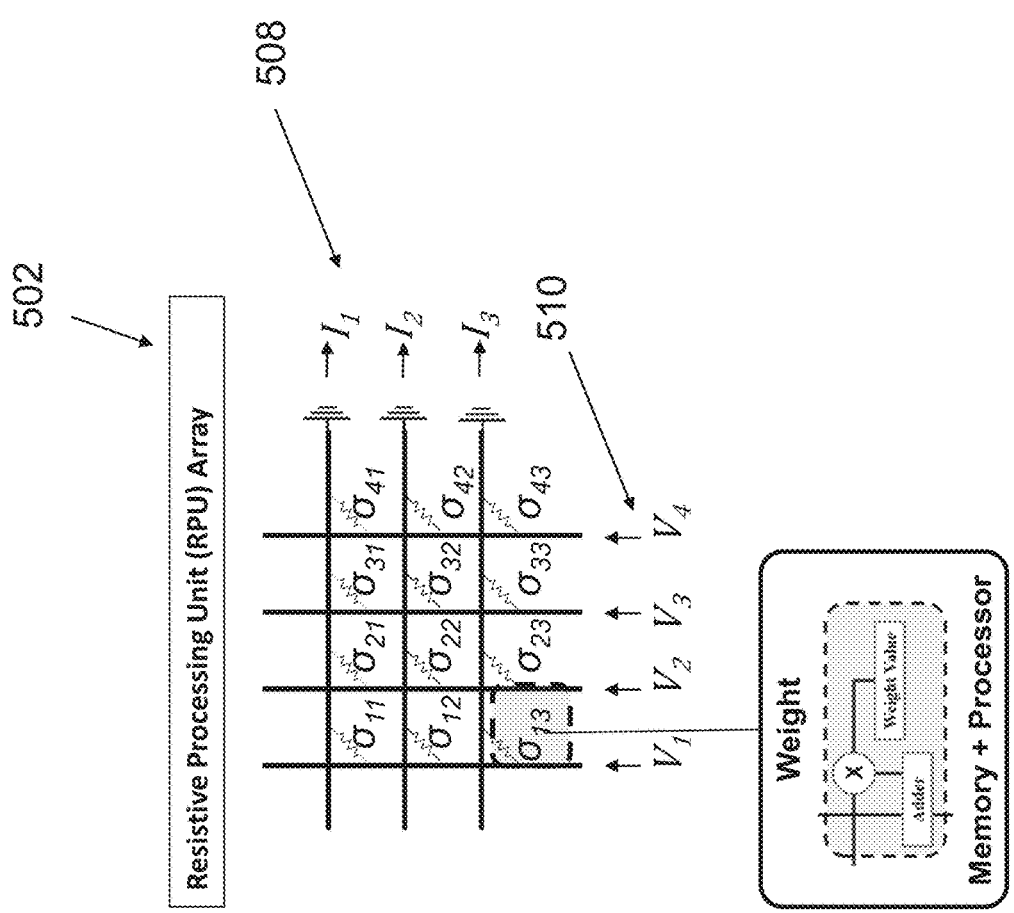
FIG. 6B illustrates Resistive Cross-Point Array Backward Pass.

FIG. 6B illustrates Resistive Cross-Point Array Backward Pass. An example resistive cross-point array (RPU) 502 is provided where output vector "y" is the current, while the input vector "x" is the voltage. The stored weight "W" is shown which is the conductance matrix σ. The computation is parallel and there is no memory operation. The current vector $I_1$ to $I_3$ 508 is the output vector "y", while the input vector "x" is shown as the vector $V_1$ to $V_4$ 510 with the conductance matrix σ.

Figure 6C:
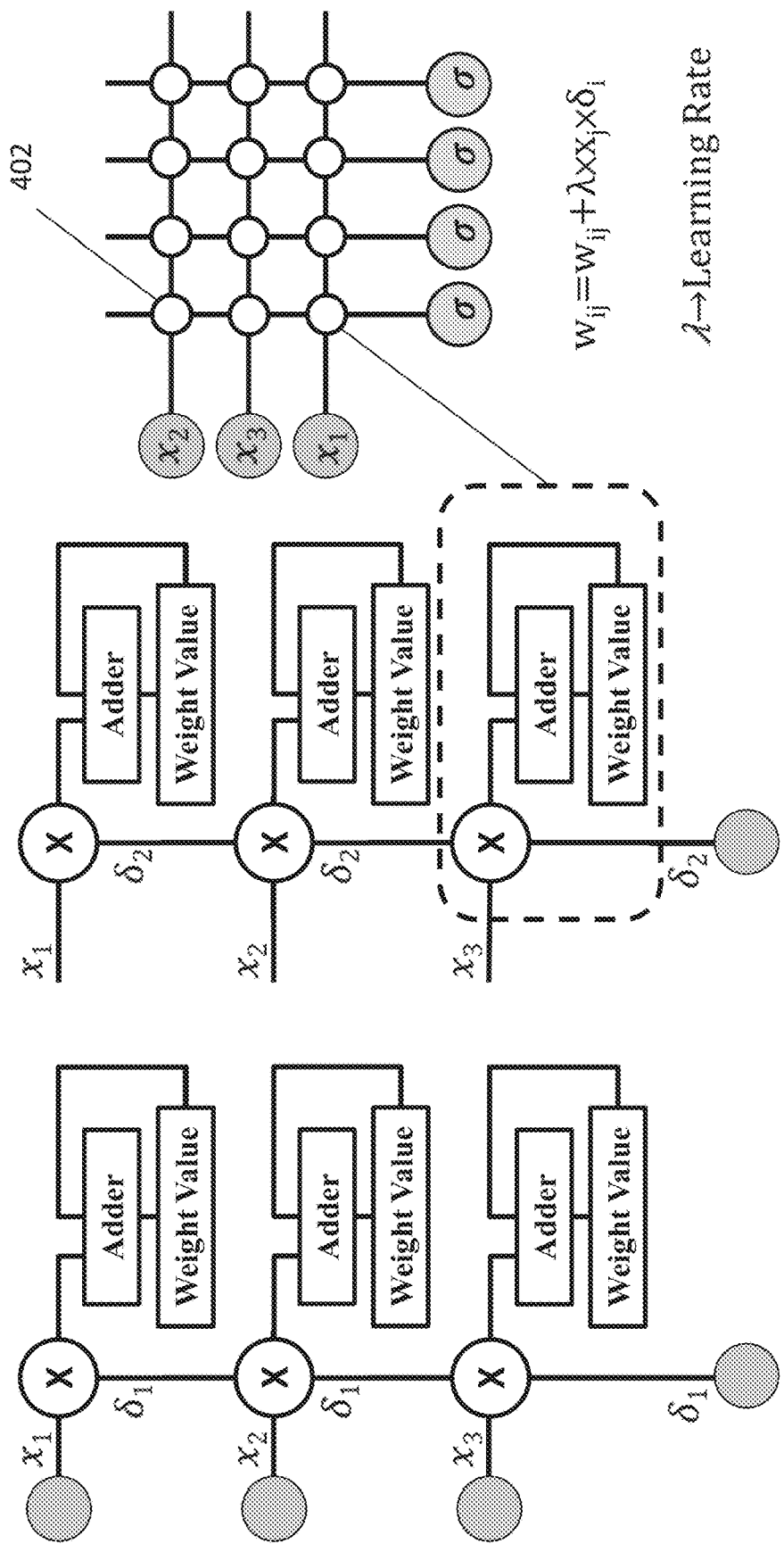
FIG. 6C illustrates a weight update cycle.

FIG. 6C illustrates a weight update cycle. Receive a vector $x_1$ to $x_3$ from rows and receive another vector δ1 to δ2 from cols and by using an adder and weight value, the calculation of $w_{ij}=w_{ij}+\Delta \times x_j \times \delta_i$ is made at each node.

Figure 7:
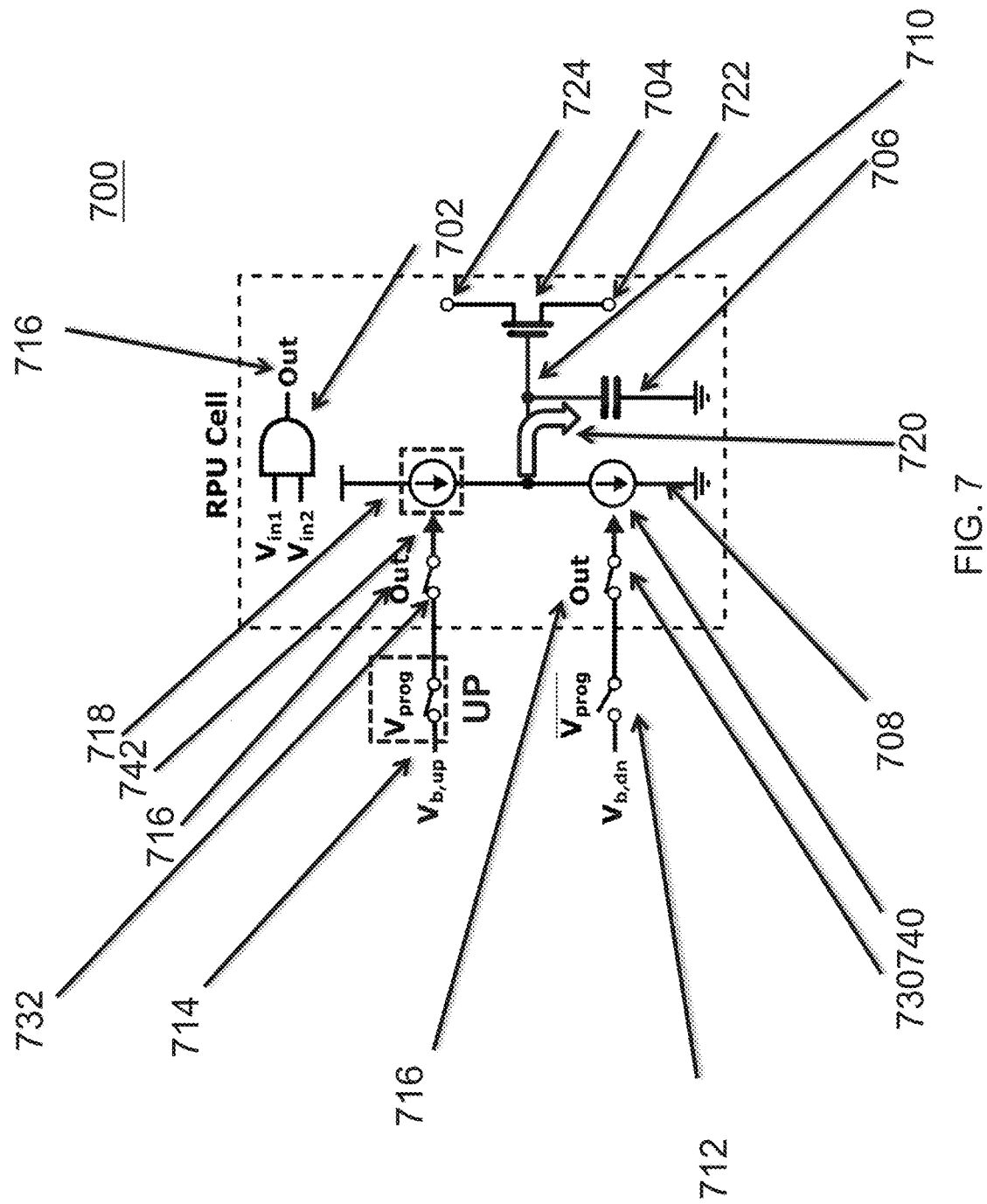
FIG. 7 illustrates an RPU cell of an exemplary embodiment during charging.

FIG. 7 illustrates an RPU cell of an exemplary embodiment during charging. This unique circuit design of the RPU cell uses CMOS (Complementary metal-oxide-semiconductor) technology to use the programmable resistive cross point devices as processing elements. In this approach the processing of the data is performed by transistors and the local weight value is stored in the capacitor as a form of electric charge.

Basically, there are two pairs of two terminal circuits, where two terminals are for updating and two terminals are for reading. First, there is Vin1 and Vin2, that are two terminals for update input at the logic AND gate (or other configurations using, for example, a NAND gate and an Inverter) 702. Whenever the inputs Vin1 and Vin2 matches or coincide, when both are in the ON state, the output signal is in the ON state at the Out 716 of the AND gate 702. Only when the OUTPUT 716 is "1", is there active connection to the two current sources 718 and 708 as seen in local switches 732 and 730. The local switches 730 and 732 are ON when the OUTPUT 716 returns an ON signal. At the transistor 704, there are two terminals (source/drain) 722 and 724 that are used to measure the resistance of this RPU device 700.

The current source 718 supplies the current into the capacitor 706 and current source 708 discharges the capacitor 706. The capacitor 706 stores the rate of the RPU device. Depending on the voltage applied to that capacitor 706, stored in that capacitor 706, the resistance of the transistor 704 changes as the control terminal or base of the transistor 704 is directly connected to the capacitor 706. Therefore, whenever the Vin1 and Vin2 at AND gate (or other configurations) 702 coincide, one of the current sources 708 or 718 (not both) are in the ON state at one time allowing the capacitor 706 to discharge or charge.

The charging or discharging is controlled by other control signals, shown as Bias voltages Vb,up and Vb,dn applied at local switches 714 and 712, respectively. The bias voltages Vb,up and Vb,dn applied to the gate terminals 742 and 740 of current mirror transistors 718 and 708, respectively, are supplied from an external circuit and also used as a global signal of programming mode (Vprog) that is used for all the RPUs 700 in an array. Vprog is globally determined to all the cells in the array. Vprogram (Vprog) at input 712 and the inverted Vprog at local switch 714 are used globally.

Therefore, when Vprog is "1" at switch 714, then the charging current source is turned ON. Also, the OUT 716 of AND gate 702 has to be ON also. Then, the current source 718 is turned ON, thus charging via current 720 to the capacitor 702 to charge the capacitor 702. Then, that changes the voltage at the transistor 704 gate 710, which changes the resistance. The complimentary switches 714 and 712 are for global Up/Down programming signal (Vprog). Vb,up provides the global UP programming signal at 714 allowing for the charging of the capacitor 702.

Referring again to FIG. 7, there is a read transistor 704, switches 714, 712, 730, and 732, current sources 708 and 718 and a capacitor 706 to implement a RPU 700. The capacitor 706 that holds electric charges represents the weight value stored in the cell, and two current sources 708 and 718 serve as update current supply to charge/discharge this capacitor 706 and change the stored weight value. The rightmost transistor is a read transistor 704 whose channel resistance is modulated by the voltage drop of the capacitor 706. One can read out the stored weight by measuring the channel resistance of the read transistor 704 from terminals 722 and 724. Since the charging and discharging of the capacitor 706 is done by constant current sources 718 and 708, respectively, the relation between voltage at the capacitor 706 and charging/discharging time is expected to be linear, and up/down symmetry is also expected.

Figure 8:
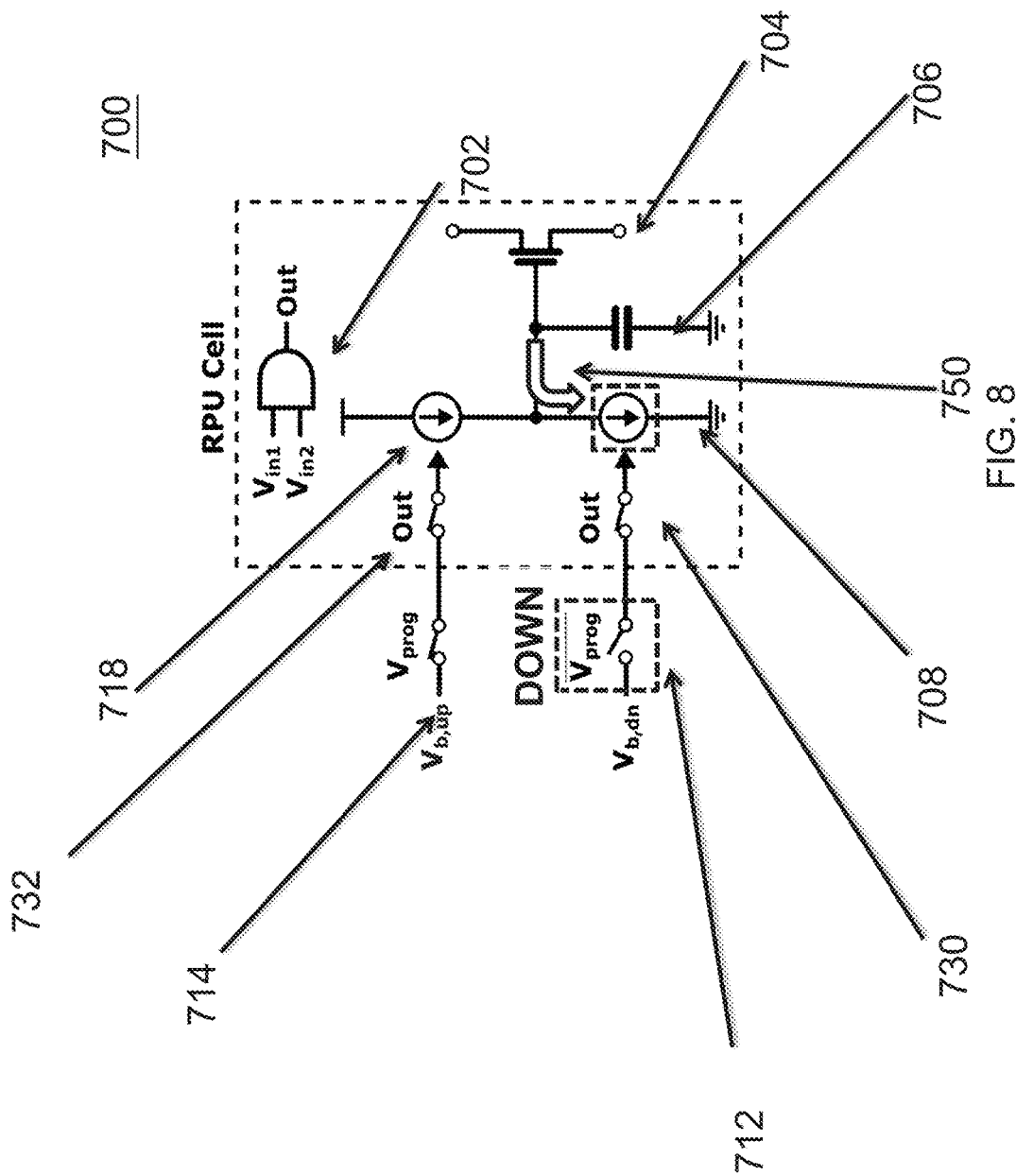
FIG. 8 illustrates an RPU cell of an exemplary embodiment during discharging.

FIG. 8 illustrates an RPU cell of an exemplary embodiment during discharging. Vb,down provides the global DOWN programming signal at 712 allowing for discharging 750 of the capacitor 702, thus changing the resistance of the transistor 704. The read transistor 704 is in a deep triode region. Therefore, current sources 718 and 708 are constant charge and discharge the capacitor 702 with constant current.

Therefore, the UP/DOWN cycle control is through using current mirror bias voltage as a signal, and the external Vprog switch. The coincidence detection is through the AND gate (or other alternative configuration using, for example, a NAND gate and inverter) and the local switches. Meanwhile, the charge storage and output is through the capacitor 706, current mirror 708 and 718, and the read transistor (read out transistor) 704.

Figure 9:
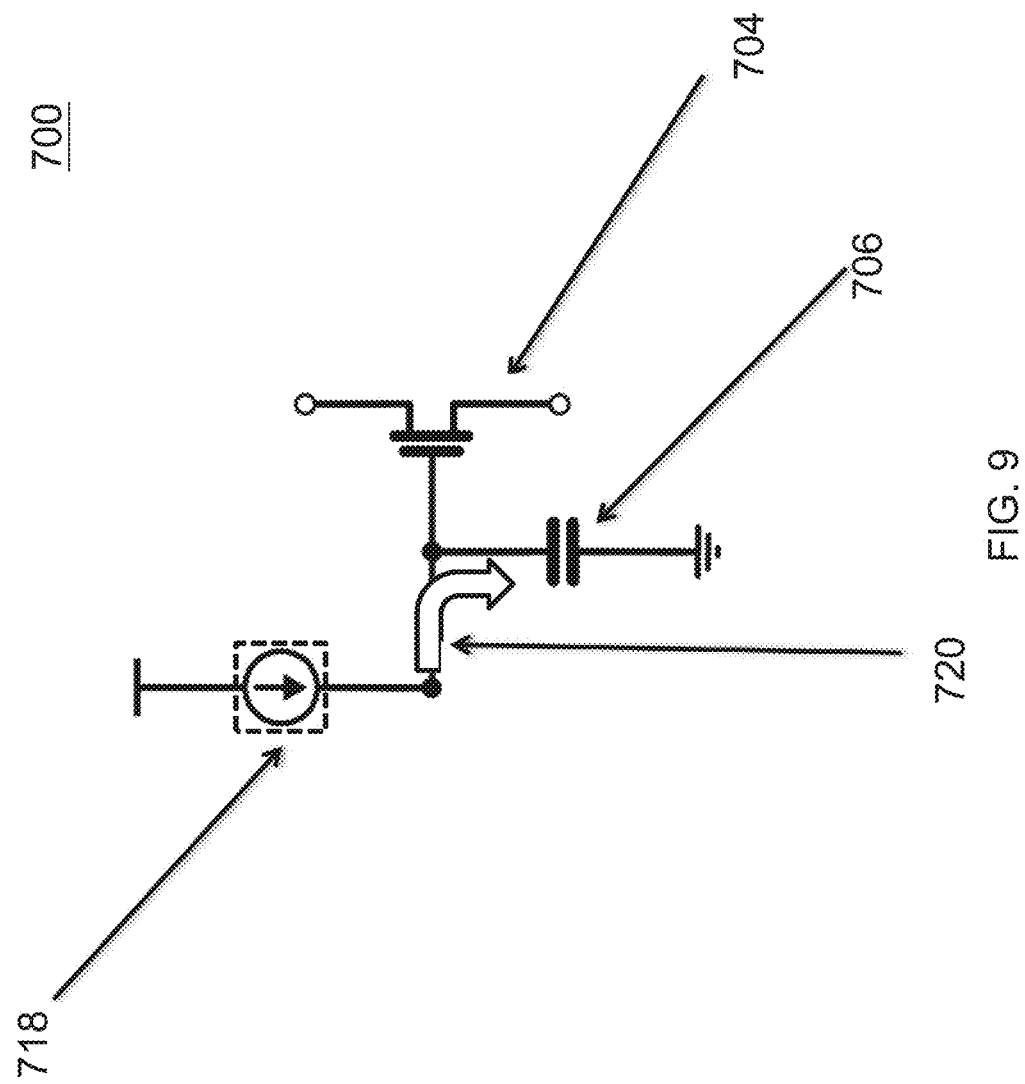
FIG. 9 illustrates a portion of the RPU of FIGS. 7 and 8 of the exemplary embodiment.

FIG. 9 illustrates a close-up portion of the circuit from FIG. 7 showing the charging the capacitor 706 and the charging current 720 from the constant current source transistor 718.

With a constant current supply:

$$i_{prog} = C_w \frac{dV_{cap}}{dt}$$

$$V_{cap} = V_0 + \frac{1}{C_w}(i_{prog} \times \Delta t \times N)$$

The Vcap voltage supplied to the capacitor is determined through the current i program ($i_{prog}$) over a change of time t, and N is the number of pulses. N∝Vcap∝Iread, where the $I_{read}$ the read current. The $V_{cap}$ and the N are noted in the equation.

When the read transistor is in deep triode region:

If $V_{DS} \ll 2(V_{GS} - V_{TH})$: $I_D = \mu_n \cdot C_{ox} \cdot \frac{W}{L} \cdot (V_{GS} - V_{TH}) \cdot V_{DS}$ -continued $$R_{ON} = \frac{V_{DS}}{I_D} = \frac{1}{\mu_n \cdot C_{ox} \cdot \frac{W}{L} \cdot (V_{GS} - V_{TH})}$$

$(I_D = I_{read}, V_{DS} = V_{read}, V_{GS} = V_{cap})$

The $I_D$ and $V_{GS}$ are noted in the equation. The same holds for the discharge case.

Figure 10:
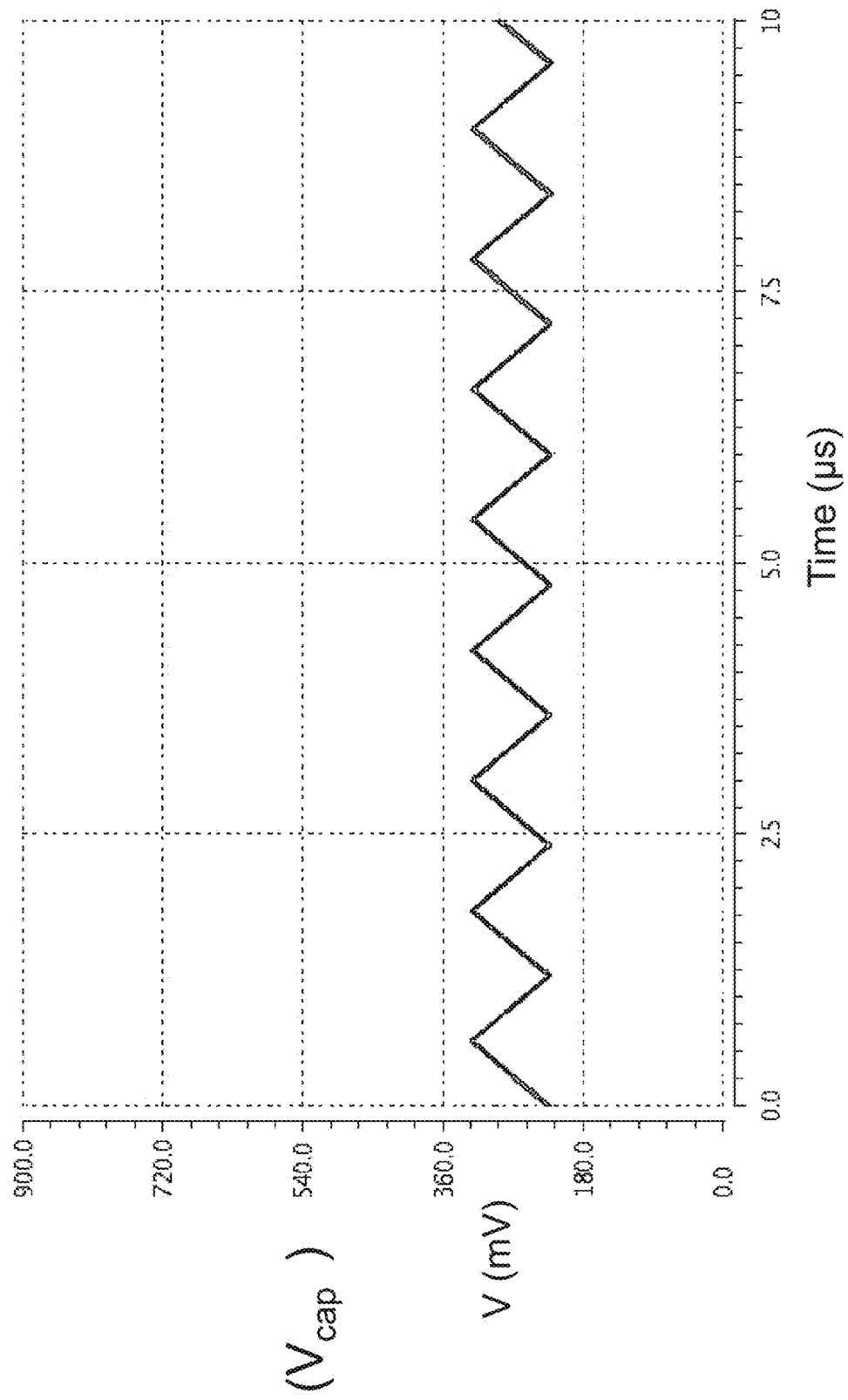
FIG. 10 illustrates a graph a response shown in circuit simulation of the exemplary embodiment.

FIG. 10 illustrates a graph a response shown in circuit simulation. The voltage at the capacitor $V_{cap}$ supplied at node 710 is graphed over time and it can be seen that the voltage is linear and symmetric over time. Circuit simulation is performed, and the results are shown FIG. 10. Therefore, an analog and incremental weight update in a linear and symmetric way is achieved.

Therefore, in the proposed circuit, a highly symmetric and linear weight update is achieved using current source-based circuit. Therefore, as shown above a mixed signal RPU circuit with silicon technology elements is proposed, which shows ideal RPU characteristic.

Referring back to FIGS. 7 through 9, some of the elements are as follows.

There is a weight capacitor 706 and a read transistor 704. The weight capacitor 706 stores the weight in the form of electric charge serving as a current integrator. The read transistor 704 converts the voltage at the weight capacitor 706 to resistance which can be accessed from source-drain terminals 722 and 724 by applying a read voltage at the gate 710 of the transistor 704.

Another set of elements is the current mirrors 708 and 718. Two current mirror transistors 718 and 708 serve as constant current sources to charge and discharge, respectively, the weight capacitor 706 with a constant current. The bias voltages to the gate terminal of current mirror transistors 718 and 708 are supplied from an external circuit and also used as a global signal of programming mode (Vprog).

Another element is the AND gate 702, which is a Coincidence detector. The AND gate 702 receives the voltage input signals from connected column and row and perform multiplication.

Other configurations can be made, for example, the NAND gate can also be connected in series to an inverter, thereby using both the output of NAND gate and the inverter (AND gate logic of the Vin1 and Vin2 and also the NAND logic output by the inverter) to control the activation of the mirror current sources 708 and 718. Other configurations can also be included.

Some of the many advantages achieved are as follows. There is highly linear and symmetric weight update. Analog, incremental weight change is also implemented. There is a high frequency update due to the potential to be low power. The present invention also provides an implementation to in a small area with deep trench capacitor, advanced silicon technology such as nanowire FET (field effect transistor), carbon nanotube FET and FinFET.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A processing unit, comprising:
   a circuit including:
   a current mirror; and
   a capacitor providing a weight based on a charge level of the capacitor,
   wherein the capacitor is charged or discharged by the current mirror.

2. The processing unit according to claim 1, further comprising a read out transistor connected to the capacitor,
   wherein a stored voltage of the capacitor is read out to a gate of an output transistor by the read out transistor.

3. The processing unit according to claim 2, wherein the output transistor translates the capacitor's voltage to a resistance.

4. The processing unit according to claim 2, wherein the read out transistor converts the voltage at the capacitor to resistance which is accessible from a source-drain terminals of the read out transistor by applying a read voltage.

5. The processing unit according to claim 1, wherein the bias voltages to a gate terminal of the current mirror transistors are supplied from and external circuit and also used as a global signal of programming mode for an array of the processing units.

6. The processing unit according to claim 1, wherein the read out transistor and current mirror each comprise a complementary-metal-oxide-semiconductor (CMOS) transistor.

7. An array of processing units comprising a plurality of the processing units according to claim 1.

8. The array of processing units according to claim 7, wherein the plurality of the processing units are configured in a cross-point array to train a neural network.

9. A method of a processing unit, the method comprising:
   charging or discharging a capacitor of the processing unit by one of at least two current mirrors; and
   providing a weight based on a charge level of the capacitor charged by the one of the at least two current mirrors.

10. The method according to claim 9, further comprising reading out a stored voltage of the capacitor to a gate of an output transistor by a read out transistor connected to the capacitor.

11. The method according to claim 10, further comprising of translating, by the output transistor, a voltage of the capacitor to a resistance value.

12. The method according to claim 9, further comprising of converting, by a read out transistor connected to the capacitor, the voltage at the capacitor to resistance accessible from source-drain terminals of the read out transistor by applying a read voltage.

13. The method according to claim 9, further comprising of supplying bias voltages to a gate terminal of the current mirror transistors from and external circuit and also using the bias voltages as a global signal of programming mode for a plurality of the processing units configured in an array.

14. The method according to claim 9, wherein the read out transistor and current mirrors each comprise a complementary-metal-oxide-semiconductor (CMOS) transistor.

15. The method according to claim 9, wherein a plurality of the processing units are configured as a cross-point array to train a neural network.

16. An array of processing units, each processing unit comprising:
    a circuit including:
    at least two current mirrors; and
    a capacitor providing a weight based on a charge level of the capacitor,
    wherein the capacitor is charged or discharged by one of the at least two current mirrors.

17. The array of processing units according to claim 16, further comprising a read out transistor connected to the capacitor,
    wherein a stored voltage of the capacitor is read out to a gate of an output transistor by the read out transistor.

18. The array of processing units according to claim 17, wherein the output transistor translates the capacitor's voltage to a resistance.

19. The array of processing units according to claim 18, wherein the read out transistor converts the voltage at the capacitor to resistance which is accessible from source-drain terminal by applying a read voltage, and
    wherein the read out transistor and current mirrors each comprise a complementary-metal-oxide-semiconductor (CMOS) transistor.

20. The array of processing units according to claim 16, wherein bias voltages to a gate terminal of the current mirror transistors are supplied from and external circuit and also used as a global signal of programming mode for each of the processing units, and
    wherein each of the processing units comprise a resistive processing unit (RPU).

* * * * *